United States Patent [19]

Mouissie

[11] Patent Number: 5,459,443
[45] Date of Patent: Oct. 17, 1995

[54] PLANAR FILTER, IN PARTICULAR FOR MULTIPLE-POLE PLUG CONNECTORS HAVING A PLUG AND A COUNTERPART PLUG

[75] Inventor: Bob Mouissie, Ek Berlicum, Netherlands

[73] Assignee: Filtec Filtertechnologie fuer die Elektronikindustrie GmbH, Lippstadt, Germany

[21] Appl. No.: 293,678

[22] Filed: Aug. 19, 1994

[30] Foreign Application Priority Data

Aug. 19, 1993 [DE] Germany ............... 43 27 850.7

[51] Int. Cl.⁶ ................................ H01R 13/648
[52] U.S. Cl. ............ 333/184; 333/185; 361/302; 361/309; 439/620
[58] Field of Search ................. 333/182, 184, 333/185; 361/309, 302, 312, 328, 329, 330; 439/607, 620

[56] References Cited

U.S. PATENT DOCUMENTS

| | | | |
|---|---|---|---|
| 5,014,026 | 5/1991 | Wanjura | 333/185 |
| 5,242,318 | 9/1993 | Plass | 439/620 |

FOREIGN PATENT DOCUMENTS

| | | |
|---|---|---|
| 0299563 | 1/1989 | European Pat. Off. . |
| 0516523 | 12/1992 | European Pat. Off. . |
| 4133352 | 6/1992 | Germany . |

*Primary Examiner*—Benny Lee
*Assistant Examiner*—David H. Vu
*Attorney, Agent, or Firm*—Herbert L. Lerner; Laurence A. Greenberg

[57] ABSTRACT

A planar filter, in particular for multiple-pole plug connectors (plugs or counterpart plugs) disposed in a housing making a ground connection, for signal lines carrying electronic signals, includes a substrate and a number of closely spaced capacitors corresponding to the number of signal lines and being disposed on the substrate. The capacitors are formed of one common ground electrode being substantially continuous at least in the peripheral region of the substrate, individual signal electrodes each being provided for one of the signal lines and being insulated from the others, and a dielectric layer between them. The substrate has openings formed therein each for one of the signal lines. The signal electrodes each extend to or into one of the openings and are connected there to one of the signal lines. Each of the capacitors is formed of a series circuit of two substantially equal-size individual capacitors forming a capacitor pair. Intermediate electrodes are applied onto the dielectric covering of the signal electrodes and to the ground electrode for forming the two series-connected capacitors, they cover both of them over approximately equal-sized area regions, and they cover the ground electrode and the associated signal electrodes with portions of approximately equal area.

17 Claims, 6 Drawing Sheets

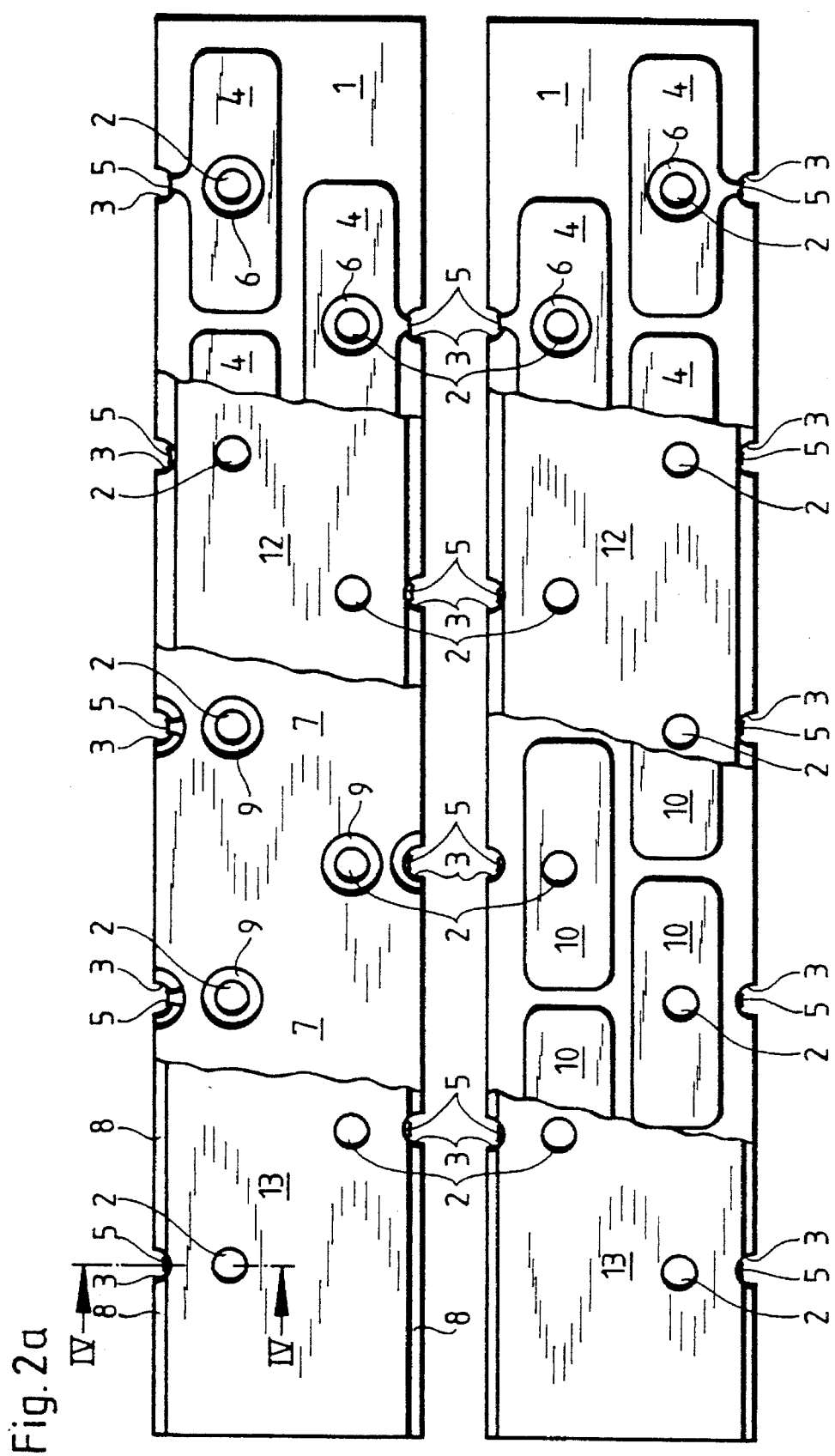

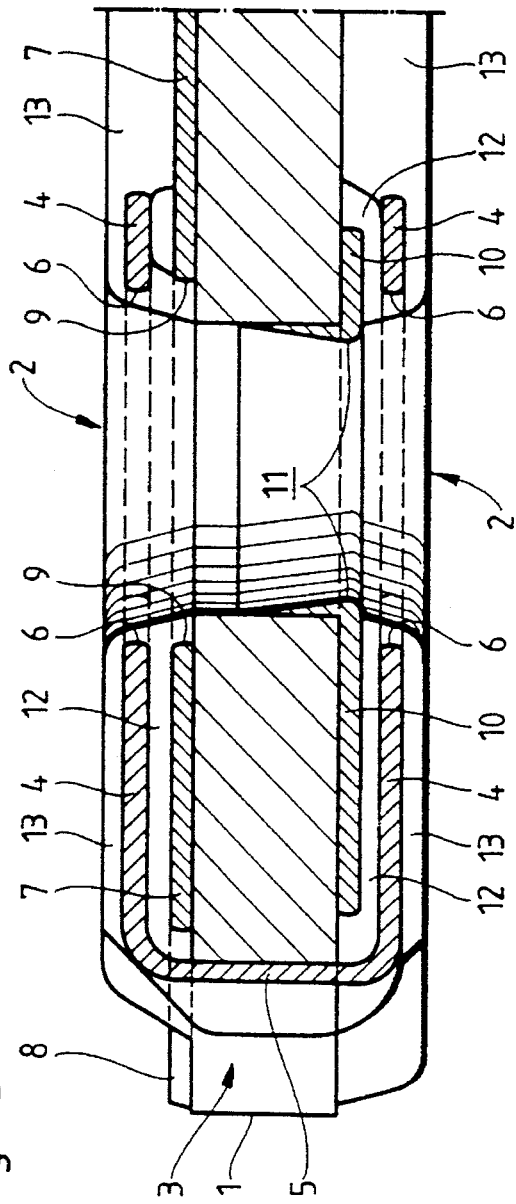

PLANAR FILTER, IN PARTICULAR FOR MULTIPLE-POLE PLUG CONNECTORS HAVING A PLUG AND A COUNTERPART PLUG

BACKGROUND OF THE INVENTION

FIELD OF THE INVENTION

The invention relates to a planar filter, in particular for multiple-pole plug connectors (plugs or counterpart plugs), being disposed in a housing that makes a ground connection, for signal lines carrying electronic signals, including a number of closely spaced capacitors corresponding to the number of signal lines and being disposed on a substrate, the capacitors being formed by one common ground electrode being essentially continuous at least in a peripheral region of the substrate, by individual signal electrodes being provided for each signal line and being insulated from the others, and by a dielectric layer between them, wherein the substrate has one opening for each of the signal lines, to or into which opening the signal electrodes extend and are connected there to the associated signal lines.

In the prior art, filters are provided in order to connect lines with which computers, for instance, or other electronic devices are connected for the purposes of signal exchange. The filters suppress electrical interference pulses that are the consequence of electromagnetic or electrostatic interference resulting from lightning or other events, for instance. Such filters are constructed as planar filters, for instance as described in French Patent No. 2 422 268, U.S. Pat. Nos. 4,791,391 or 4,070,084. In each signal connection, a capacitor or a capacitor and inductive resistor combination in the form of a Pi and L filter is provided as a filter element. The capacitors, which are generally made by thick-film technology, have limited electric strength, which is conditional on the material. The construction of the filter and the materials used for it are decisive for the magnitude of the electric strength. If barium titanate in the form of a thin strip or a screen-printed coating applied in paste form is used as the dielectric in the capacitors, for instance, then both the strip and the screen-printed application are fired after the joining or multilayer printing has been carried out. The resultant thin dielectric layers have a limited electric strength. Both the type of dielectric and its contamination from inclusions as well as the development of spines or sharp points on the coatings that as a rule are applied by screenprinting to the capacitors, play a role, since corona discharges can develop that cause channeling and are thus the source of dielectric breakdowns in the final analysis.

The electric strength of such planar filters is increasingly important for use in telecommunications, for instance. The present requirements in terms of surge voltages (test values of 1,000 V with a 10 µs rise and a 350 µs drop, for instance) in telecommunications, for instance, has exceeded the electric strength of many capacitors used until now for the desired filter properties (capacity, frequency). In order to increase the electric strength by increasing the layer thickness, a reduction in capacity must be accepted, although it could be compensated for by raising the dielectric constant, so the material constant might be "outbid". It therefore appears advantageous to improve the filter element so that it meets the higher requirements.

SUMMARY OF THE INVENTION

It is accordingly an object of the invention to provide a planar filter, in particular for multiple-pole plug connectors having a plug and a counterpart plug, which overcomes the hereinafore-mentioned disadvantages of the heretofore-known devices of this general type, in such a way that the security against electromagnetic or electrostatic interference is further reduced and moreover in such a way that the plug connector is producible economically and is usable with safety and freedom from interference.

With the foregoing and other objects in view there is provided, in accordance with the invention, a planar filter, in particular for multiple-pole plug connectors (plugs or counterpart plugs) disposed in a housing making a ground connection, for signal lines carrying electronic signals, comprising a substrate having a peripheral region; a number of closely spaced capacitors being disposed on the substrate and corresponding to a number of signal lines; the capacitors being formed of one common ground electrode being substantially continuous at least in the peripheral region of the substrate, individual signal electrodes each being provided for a respective one of the signal lines and being insulated from the others, and a dielectric layer between them; the substrate having openings formed therein each for a respective one of the signal lines, the signal electrodes each extending to or into a respective one of the openings and being connected there to a respective one of the signal lines; each of the capacitors being formed of a series circuit of two substantially equal-size individual capacitors forming a capacitor pair, wherein the series circuit is achieved thereby; and intermediate electrodes being applied onto the dielectric covering of the signal electrodes and to the ground electrode for forming the two series-connected capacitors, the intermediate electrodes covering both of them over approximately equal-sized area regions, and the intermediate electrodes covering the ground electrode and the associated signal electrodes with portions of approximately equal area.

As a result of this series connection of two capacitors of virtually equal size, the energy storable in the capacitors and thus the voltage to which each of these capacitors is exposed are divided approximately in half. By applying the voltage V to the coatings of this kind of capacitor, the field intensity that is definitive for the breakdown is produced, as expressed by the formula E 32 V/S, in which S is the layer thickness of the dielectric. With a field intensity E of the same magnitude and a series circuit of two essentially equal-sized capacitors, the voltage at the capacitors will be equivalent to the limit value, so that the total voltage with which this capacitor array can be loaded approximately doubles. The shielding provided by the substantially continuously constructed ground electrode, the low electrode resistance (which is low compared with the longitudinal inductive resistance of the signal line passing through the plug connector) and the compact construction that avoids rise time effects, are preserved.

In accordance with another feature of the invention, in order to obtain this circuit by thick-film technology on a substrate provided with through holes for the signal pins, the two series-connected capacitors are disposed on one side of the substrate, and the ground electrode and the signal electrodes are disposed on that side of the substrate in the same plane and are covered with a dielectric layer, over which the intermediate electrodes associated with each of the signal electrodes are applied.

In accordance with a further feature of the invention, in order to obtain the connection with ground which is, for instance, defined by a metal plug housing, the ground electrode forms an exposed ground contact bank or strip. This embodiment is simple and therefore economical to produce. However, only pairs of capacitors having a capacitance which is limited because of the space required for the two capacitors located in the same plane can be produced.

The capacitance is determined not only by the area covered but also by the thickness of the dielectric layer and the dielectricity constants of the material, and the lesser covered area can be compensated for by the choice of materials having high dielectric constants.

In accordance with an added feature of the invention, one of the two series-connected capacitors is disposed on one side and the other is disposed on the other side of the substrate, the two capacitors each have one intermediate coating as an intermediate electrode, the electrodes are connected to one another through a bridge wrapping around the edge of the substrate, and the ground electrode is applied as a continuous electrode to one of the two sides of the substrate in such a way that the signal pin leadthroughs are exposed.

In accordance with an additional feature of the invention, the intermediate electrodes for each of the signal electrodes are applied on the other side of the substrate, they are connected to essentially equal-sized intermediate electrodes on the ground electrode, and a dielectric layer that is between the intermediate electrodes associated with the ground electrode and the intermediate electrodes is applied by screenprinting like the metal layers of the electrodes.

The intermediate electrodes are electrically connected with one another over the peripheral region of the substrate through bridges. To that end, the bridges wrap around the substrate in a U, and recesses are provided in the peripheral region for the bridges. With regard to the capacitances attainable in that case, the same applies as has already been mentioned above. Since in that case the covered area can be chosen to be larger, either capacitors with higher capacitances or (because of the thicker dielectric layer) with higher individual electric strength can be produced. The (relatively) large recesses in the ground electrode in this embodiment result in a reduction in the desired shielding effect of the ground electrode.

In accordance with yet another feature of the invention, in order to counteract this reduction, the ground electrode is wrapped over the edge of the substrate at least at one point and preferably on both longitudinal sides of the planar filter and is extended over the rear side of the substrate in the form of a metallizing coating that is generally flat and continuous except for recesses in the region of the signal line leadthroughs. As a result, effective shielding is achieved so that the planar filter not only filters the various signal lines together with the metal housing of the plug connector but also offers effective protection against the intrusion of electromagnetic waves or pulses.

In accordance with yet a further feature of the invention, the ground electrode, which is substantially continuous except for the recess in the region of the pin leadthroughs, is also recessed in the region of the intermediate electrode wraparounds and forms a contact bank between the intermediate electrode wraparounds that is exposed for contacting. This contact bank permits a direct ground connection to a metal housing in which the planar filter is installed. Moreover, it also permits measurement of each of the pairs of capacitors between the respective signal electrode and the ground electrode.

In accordance with yet an added feature of the invention, the ground electrode and the signal electrodes are applied directly onto the substrate, with the ground electrode being applied to one flat side and the signal electrodes to the other flat side of the substrate, so that one dielectric layer is applied to each of the two metallizing layers; the intermediate electrodes are applied to the dielectric layers; and preferably the thus-formed planar filter is provided on one or both sides with a protective covering that leaves the exposed regions of the ground electrode near the edge, free in order to form the contact bank.

In accordance with yet an additional feature of the invention, the intermediate electrodes are applied directly to both flat sides of the substrate, except for the regions surrounding the openings of the signal line leadthroughs; so that the two metallizing layers of the intermediate electrodes are each covered by one dielectric layer; the substantially continuously constructed ground electrode and the individual signal electrodes are applied to these dielectric layers, and preferably the thus-formed planar filter is provided on one or both sides with a protective covering that leaves the exposed regions of the ground electrode near the edge, free in order to form the contact bank.

In accordance with a concomitant feature of the invention, the intermediate electrode of the first capacitors of the pairs of capacitors is applied to one flat side and one of the other capacitor electrodes of the second capacitors of the pairs of capacitors is applied directly to the other flat side of the substrate and each are covered with one dielectric layer; so that the other capacitor electrodes of the first capacitors of the pairs of capacitors are applied to the dielectric layer covering its intermediate electrode and the intermediate electrodes of the second capacitors of the pairs of capacitors are applied to the dielectric layer covering the other capacitor electrodes; and preferably the thus-formed planar filter is provided on one or both sides with a protective covering that leaves the exposed regions of the ground electrode near the edge, free in order to form the contact bank.

With these embodiments, the series circuit of the two approximately equal-sized capacitors of each of the pairs of capacitors becomes economically and technologically feasible in a simple fashion. The voltage load on the series-connected capacitors is thus divided approximately in half, in accordance with the ratio of capacitances of the capacitors of each pair of capacitors. The attendant reduction in capacitance to approximately half as a result of this series connection is tolerable, especially in telecommunications tasks. If a certain capacitance is specified in other instances of use, then for the area which is determined by the geometry and is available to the capacitors and for the thickness of the dielectric, which is specified by the electric strength, this can be achieved in most cases by the choice of dielectric constants of the material for the electric layer. Each of the capacitances of the capacitors can be measured and thus monitored. The contact banks and the bridges on one hand and the metallizings in the signal pin leadthroughs (or the soldered-in signal pins) and the bridges on the other hand serve this purpose, and breakdowns can also be discovered with these monitoring capabilities.

This embodiment of the invention enables a very simple, economical manufacture of the planar filter: the substrate is coated on both sides with the required structured by screenprinting, and these structures are fired in the usual way by thick-film technology. This produces a compact planar filter, in which each capacitor can be checked individually and complete planar filters can moreover be checked for breakdowns. If both capacitors of each of the pairs of capacitors have approximately the same capacitance, then voltage surges strain both capacitors of one or each of the pairs in the same way, so that each of the series circuits of these two capacitors, which circuits are individually associated with the signal lines, can be loaded with voltage peaks of twice the height as compared with single capacitors.

Other features which are considered as characteristic for the invention are set forth in the appended claims.

Although the invention is illustrated and described herein as embodied in a planar filter, in particular for multiple-pole plug connectors having a plug and a counterpart plug, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2a and 2b are respective partly broken-away plan views of a planar filter as seen from above and from below with the capacitors on both sides of the substrate;

FIG. 4a, 4b and 4c are sectional views of the planar filter at the level of a signal line leadthrough, in which FIG. 4a shows capacitors in one plane, FIG. 4b shows intermediate electrodes directly on the substrate and FIG. 4c shows ground and signal electrodes directly on the substrate;

FIG. 5b is a substitute circuit diagram of the capacitor array for a signal line corresponding to the embodiment of FIG. 4a.

DESCRIPTION OF THE PREFERRED EMBODIMENTS

Figure 1:
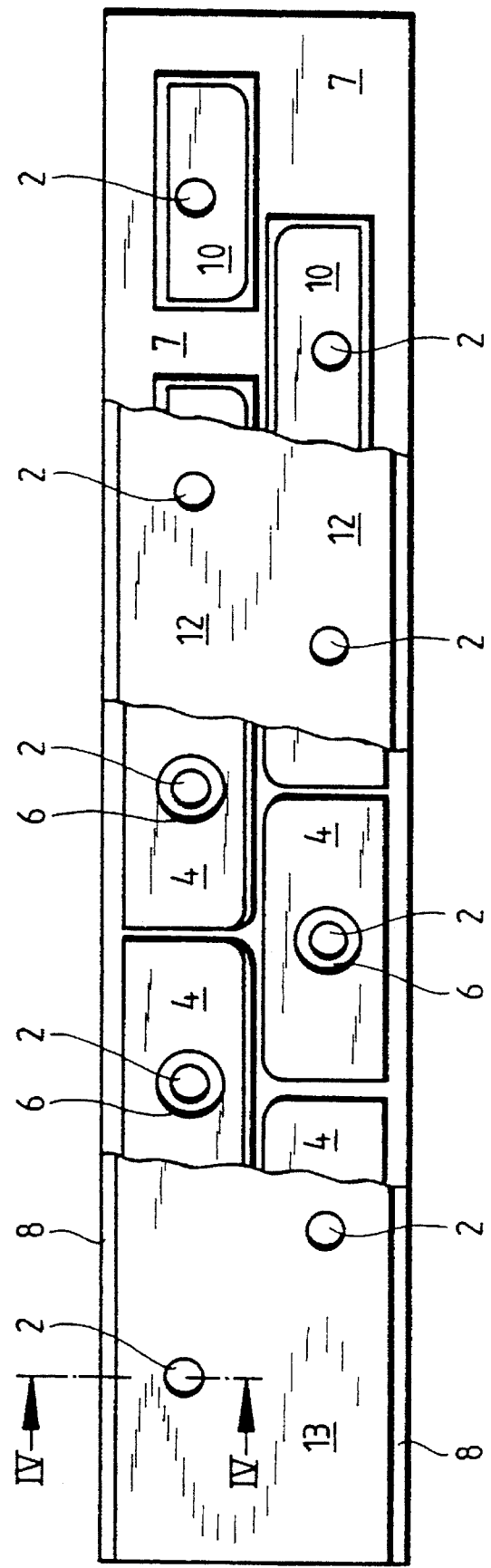
FIG. 1 is a diagrammatic, partly broken-away plan view of a planar filter having capacitors on one side of a substrate.

Referring now to the figures of the drawing in detail and first, particularly, to FIG. 1 thereof, there is seen a plan view of a planar filter having series-connected capacitors in pairs of capacitors, with various layers being partly cut open, so that the order of the layers, which as a rule are applied by screenprinting, can be seen. Ground electrodes 7 are applied to a substrate carrier 1 seen in the other figures as a carrier in such a way that they wrap all the way around the edge and leave uncovered only an inner region, in which signal pin leadthroughs are provided. In this uncovered region, signal electrodes 10 corresponding to leadthrough openings 2 for signal lines are disposed in the same plane as the ground electrodes 7. This electrode layer is covered with a dielectric layer 12, which leaves a peripheral strip free for forming a contact bank or strip 8 for contact with the ground electrode 7. The dielectric layer 12 forms the insulating dielectric of the capacitors of the planar filter. Intermediate electrodes 4 are applied to this dielectric layer, corresponding to the signal electrodes 10 and covering both the signal electrodes 10 and the ground electrodes 7. The various covered areas are of approximately equal size, so that because of the uniform dielectric constants of the material of the dielectric layer 12 and because of the (virtually) uniform thickness, capacitors are formed that have substantially the same capacitances. The geometry of the electrodes, which are preferentially applied by screenprinting, is chosen to meet the various needs and requirements and is not bound to the exemplary view chosen and shown in FIG. 1. Each intermediate electrode 4 forms both the one coating of the capacitor formed by the signal electrode 10 and by the ground electrode, and moreover also establishes the electrical connection of these two capacitors in such a way that they are series-connected. The entire array is provided with a protective coating 13 as well, which protects the thus-formed planar filter against external influences.

FIGS. 2a and 2b are plan views of the planar filter, with FIG. 2a being a top-plan view and FIG. 2b being a bottom-plan view. The terms top and bottom are understood to be relative and interchangeable. The order of the layers has been uncovered from left to right in both views, so that the complete planar filter can be seen at the outer left and the substrate carrier 1 can be seen at the outer right. Specifically, a first layer which is the substrate carrier 1 is provided with the leadthrough openings 2 for the signal pins or signal lines, which in this case are disposed in two rows that are offset from one another. The edge of the substrate carrier has peripheral recesses 3 formed therein, corresponding to the leadthrough openings 2 and being constructed to be semicircular in the view chosen. A second layer, which is applied by screenprinting to the surface of the substrate carrier, contains the intermediate electrodes 4, of which one is provided for each of the leadthrough openings 2 on each of the two sides of the substrate carrier 1. The intermediate electrodes are provided with bridges 5, which electrically connect corresponding intermediate electrodes to one another across the peripheral recesses 3. The next or third layer is the dielectric printed layer 12 that acts as a dielectric of the capacitors and insulatingly covers the intermediate electrodes of the two sides of the substrate carrier. This dielectric layer 12 is not extended as far as the edge but rather leaves the striplike contact banks 8 of the ground electrode exposed at the edge, as is shown in FIG. 2b. The bridges 5 are thus covered up to a point just at the peripheral recess 3. In the next or fourth layer, the two sides of the planar filter differ: while the signal electrodes 10 being carried to the signal lines and electrically connected to them are printed on one side shown in FIG. 2b, the other side shown in FIG. 2a includes the ground electrode 7, which is constructed in such a way as to be continuous, except for the exposures from corresponding setbacks provided around the signal electrodes and around the peripheral recesses, and the ground electrode 7 extends as far the edge of the substrate carrier 1. The signal electrodes 10 are carried as far as or into the leadthrough openings 2, where they form metallized surfaces 11 shown in FIG. 3b, with which the non-illustrated leadthrough signal pins are electrically and mechanically connected. Soldered connections are advantageously used. In a fifth layer, both the ground electrode and the signal electrodes are finally provided with the protective coating 13 that protects the planar filter against mechanical and corrosive attacks.

Figure 3A:
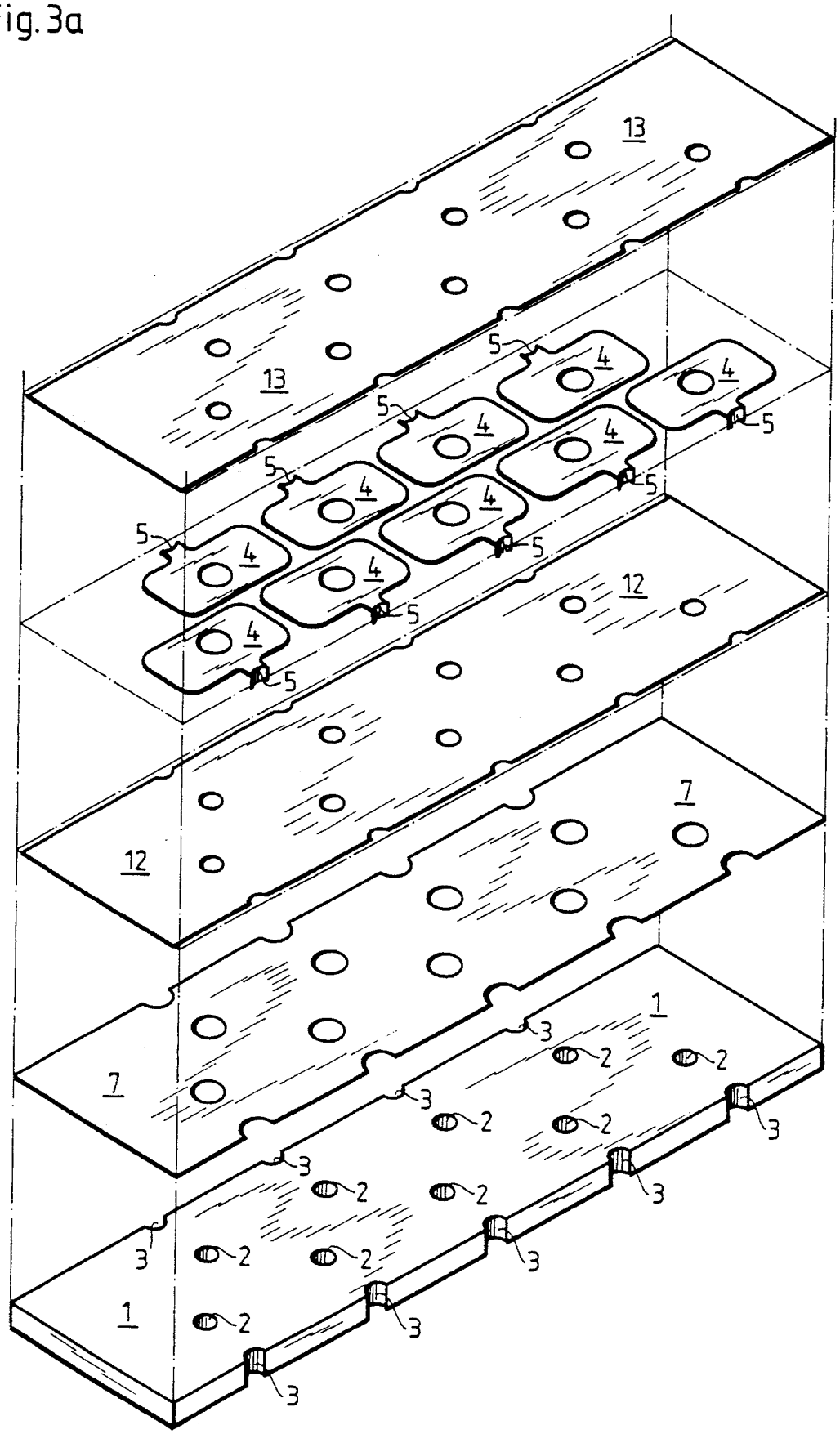
FIG. 3a and 3b are respective exploded perspective views of a layered structure of the planar filter as seen from the top and from the bottom of a substrate carrier.
Figure 3B:
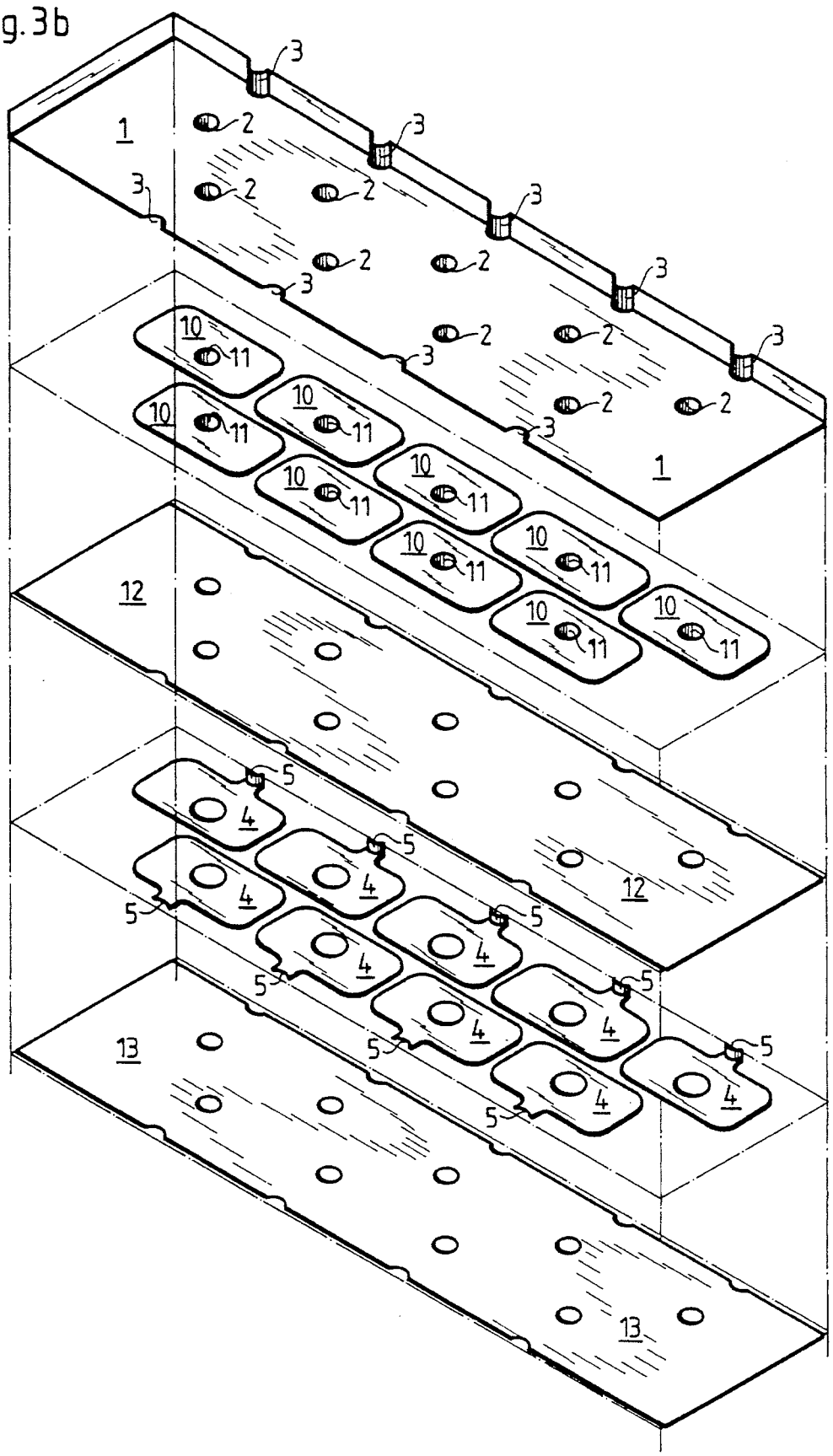

FIGS. 3a and 3b are exploded perspective views of the planar filter as seen from above in FIG. 3a and from below in FIG. 3b. For clarity, the layers which are applied directly on one another by screenprinting are shown separately from one another. The planar filter shown in FIGS. 3a and 3b differs from the planar filter shown in FIGS. 2a and 2b in that the surface of the substrate carrier is printed with the ground electrode 7 in FIG. 3a and with the signal electrodes 10 in FIG. 3b. The substantially continuously constructed ground electrode 7 is printed on the surface (which is located on the top in this case) of the substrate carrier 1 having the leadthrough holes 2 and the peripheral recesses 3. This ground electrode forms a coating extending from edge to edge and thus exhibits an adequate shielding action. Disposed on the ground electrode 7 is the dielectric 12, which extends from the narrow side to the narrow side, but leaves a peripheral strip free on the long sides for forming the contact bank 8 seen in FIG. 2. The intermediate electrodes 4 printed on the dielectric 12 follow in the next layer, thus forming first capacitors of the pairs of capacitors. The bridges 5 of the intermediate electrodes 4, that lead to the intermediate electrodes 4 on the other side of the substrate carrier 1 shown in FIG. 3b, produce the electrical connection. Finally, the protective coating 13 is applied to the surface of the filter as the last layer, and once again the peripheral region is kept free in order to form the contact bank 8. The underside of the substrate carrier 1 is occupied by the signal electrodes 10, which protrude with their metallized surfaces or extensions 11 into the leadthrough openings 2 and thus offer the capability of connection to the signal pin. The dielectric layer 12, which forms second capacitors of the pairs of capacitors with the intermediate electrodes 4 provided in the next layer, is printed on these signal electrodes 10. The connection with the first capacitors is made through the bridges 5 in such a way that pairs of these capacitors are each connected in series. The last layer once again is the protective covering 13.

Figure 4A:
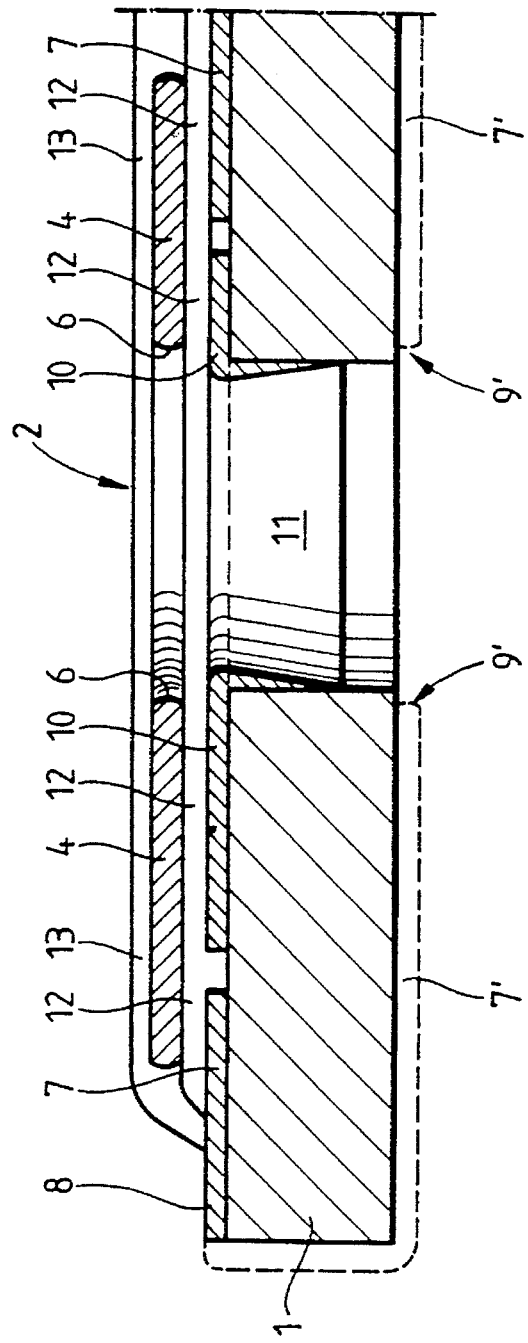

FIGS. 4a, 4b and 4c each show a section (carried as far as the center of the planar filter) at the level of a signal pin leadthrough 2. FIG. 4a shows a cross section through a planar filter having capacitor pairs that are disposed in one plane on the substrate 1. The ground electrode 7 is extended on at least one side and advantageously both sides as far as the edge of the substrate and there forms the contact bank 8. In the region of the signal pin leadthrough 2, the signal electrode 10 is provided on the same surface of the substrate. This electrode 10 is passed into the leadthrough opening 2 as the metallized surface or extension 11, where it is soldered to the non-illustrated signal pin. The dielectric layer 12 which is applied over these two electrodes covers these two layers in an insulating fashion and also fills up the interstices. The intermediate electrode 4 which is applied onto this dielectric layer 12 covers both the signal electrode 10 and the ground electrode 7. The covering surfaces form the two capacitors which are connected in series by the ground electrode itself. In order to achieve adequately identical capacitances for these two capacitors, the covering areas are made approximately the same size. To that end, the geometries of the signal electrode and the ground electrode 7 are adapted to one another as is seen in FIG. 1 in such a way as to achieve this virtual equality. If an adequate shielding action is required, then the ground electrode 7 can be pulled around the edge of the substrate 1 and forms a shield 7' on the rear side. Except for the signal pin leadthroughs, this shield 740 extends completely over the surface of the substrate, and the shield has a setback 9' in the region of its leadthroughs 2 in order to avoid a short circuit with the signal pins.

FIG. 4b shows a structure in which the ground electrode 7, on one hand, and a signal electrode 10, on the other hand, are printed directly on the surface of the substrate carrier 1. It can be clearly seen in this case that the ground electrode has a setback 9 relative to the leadthrough opening 2. This assures that a short circuit cannot occur between the two elements. The signal electrode 10 is provided with a metallizing surface or extension 11 extending into the leadthrough opening, for connection with the signal pin carried through the leadthrough 2. Each of the two electrodes 4 and 10 is covered with its own dielectric layer 12, which protrudes past the electrodes. The ground electrode 7 outside the peripheral recesses 3 is extended as far the edge of the substrate carrier, where it forms the contact bank 8 that is kept free of the dielectric. The intermediate electrodes 4 are then printed, each corresponding to one another, onto the dielectric layers 12. The intermediate electrodes are electrically connected to one another through the bridges 5 extending at the depth of the peripheral recess 3 and are therefore insulated from the ground electrode, in order to provided the series connection of the capacitors of each of the pairs of capacitors. The protective layer 13 covers the thus-formed planar filter on both sides, while the contact banks 8 are kept exposed. FIG. 4c shows a different configuration, in which the intermediate electrodes 4 are printed directly onto the surface of the substrate carrier 1 and are overprinted with the dielectric layer 12. Once again, the bridge that produces the electrical connection extends at the depth of the peripheral recess 3. The ground electrode 7 and the signal electrode are printed onto these dielectric layers, with each electrode being on a different side of the substrate carrier. The ground electrode has the recess that forms the setback 9, and the signal electrode 10 has the metallizing extension 11 extending into the leadthrough opening 2. The protective coating 13 covers both layers, and once again the contact banks 8, which are formed by the ground electrode that is extended as far as the edge of the substrate carrier, are kept exposed.

Figure 5B:
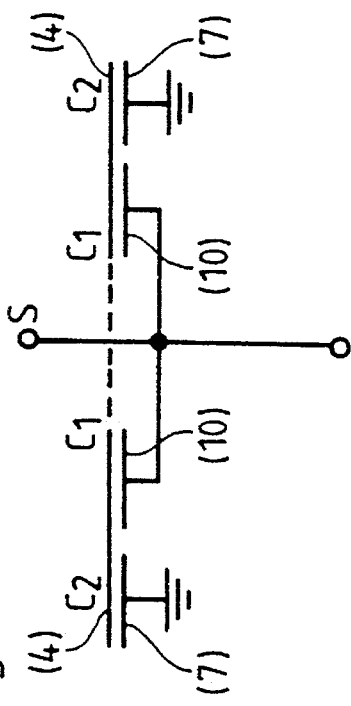
Figure 5A:
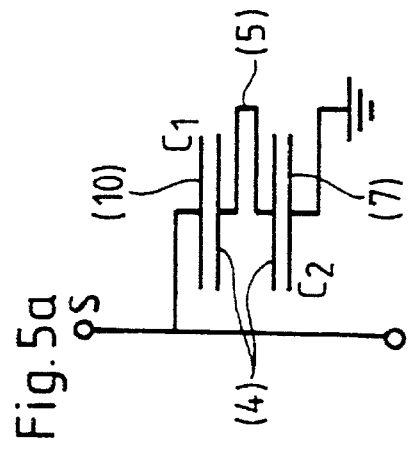
FIG. 5a is a substitute circuit diagram of the capacitor array for a signal line corresponding to the embodiment of FIG. 4b or FIG. 4c.

Finally, FIGS. 5a and 5b show two substitute circuit diagrams of such configurations, including first and second series-connected capacitors $C_1$ and $C_2$, of which the first capacitor $C_1$ is connected to a signal line S, and the second capacitor $C_2$ is connected to ground. FIG. 5a corresponds to the embodiment shown in FIG. 4b or FIG. 4c, and FIG. 5b corresponds to the embodiment of FIG. 4a. In both substitute circuits the signal line S is connected to a first coating (10) of the first capacitor $C_1$, which coating corresponds to the signal electrode of the previous examples, while the ground electrode (7) is connected to ground, such as through a metal housing of a non-illustrated plug, and is thus at "ground potential". The coating corresponding to the intermediate electrode (4) and producing the bridging connection forms the second coating of the first capacitor $C_1$ and, in the case of the exemplary embodiment of FIG. 5a, is connected through the bridge (5) to the first coating (4) of the second capacitor $C_2$ which in this case forms the intermediate electrode. The second coating of this second capacitor $C_2$, which corresponds to the ground electrode, furnishes the charge-eliminating ground connection. In FIG. 5b, this coating corresponding to the intermediate electrode (4) and producing the bridging connection forms the second coating of the first capacitor $C_1$, which is constructed metallically except for the region of the signal-electrode leadthrough (suggested in dashed lines in this case) and changes into the first coating of the second capacitor $C_2$ and is thus through-connected. The second coating of this second capacitor $C_2$, which corresponds to the ground electrode, furnishes the charge-eliminating ground connection. This produces the series connection of the two capacitors, which is repeated on the substrate of the filter from one pair of capacitors to another.

I claim:

1. A planar filter for signal lines carrying electronic signals, comprising:

a substrate having a peripheral region;

a number of closely spaced capacitors corresponding to a number of signal lines and being disposed on said substrate;

said capacitors being formed of one common ground electrode being substantially continuous at least in said peripheral region of said substrate, individual signal electrodes each being provided for a respective one of the signal lines and being insulated from others of the signal lines, and a dielectric layer between said ground electrode and said signal electrodes;

said substrate having openings formed therein each for a respective one of the signal lines, said signal electrodes each extending to or into a respective one of said openings and being connected to a respective one of the signal lines at said respective opening;

each of said capacitors being formed of a series circuit of two substantially equal-size individual capacitors forming a capacitor pair; and intermediate electrodes being applied onto said dielectric layer covering said signal electrodes and to said ground electrode for forming said two series-connected capacitors, said intermediate electrodes covering said dielectric layer covering said signal electrodes and said ground electrode over approximately equal-sized area regions, and said intermediate electrodes covering said ground electrode and said associated signal electrodes with portions of approximately equal area.

2. The planar filter according to claim 1, wherein said substrate has two sides, said two series-connected capacitors are disposed on one of said sides of said substrate, and said ground electrode and said signal electrodes are disposed on said one side of said substrate in the same plane and are covered with said dielectric layer, over which said intermediate electrodes associated with each of said signal electrodes are applied.

3. The planar filter according to claim 2, including longitudinal sides of the planar filter, said ground electrode having two sides, and at least one of said sides forming an exposed ground contact bank at one of the longitudinal sides.

4. The planar filter according to claim 3, wherein said openings are signal pin or signal line leadthroughs, and said ground electrode leads to the other of said sides of said substrate at least at one point and forms a shielding layer with a setback in the vicinity of said signal pin leadthrough on said other side, except at said signal line leadthroughs.

5. The planar filter according to claim 4, wherein said ground electrode leads to the other of said sides of said substrate on each of said longitudinal sides of the planar filter.

6. The planar filter according to claim 1, wherein said substrate has two sides and an edge, one of said two series-connected capacitors is disposed on one of said sides and the other of said two series-connected capacitors is disposed on the other of said sides of said substrate, each of said capacitors have one intermediate coating as said intermediate electrode, and including bridges wrapping around said edge of said substrate and connecting said intermediate electrodes to one another.

7. The planar filter according to claim 6, wherein said substrate has recesses formed in said edge in the vicinity of said bridges.

8. The planar filter according to claim 7, wherein said recesses are semicircular.

9. The planar filter according to claim 5, wherein said openings are pin leadthroughs, and said ground electrode is substantially continuous and has recesses formed therein in the vicinity of said pin leadthroughs, has recesses formed therein in the vicinity of said bridges and forms a contact bank between said bridges being exposed for contacting.

10. The planar filter according to claim 6, wherein said openings are pin leadthroughs, and said ground electrode is substantially continuous and has recesses formed therein in the vicinity of said pin leadthroughs, has recesses formed therein in the vicinity of said bridges and forms a contact bank between said bridges being exposed for contacting.

11. The planar filter according to claim 4, including another dielectric layer; said two sides of said substrate being flat; said ground electrode being a metallizing layer applied directly to one of said flat sides and said signal electrodes being a metallizing layer applied directly to the other of said flat sides of said substrate; each of said dielectric layers being applied to a respective one of said metallizing layers; and said intermediate electrodes being applied to said dielectric layers.

12. The planar filter according to claim 11, wherein said ground electrode has an edge, and including at least one protective covering disposed on at least one side of the planar filter leaving exposed regions near said edge of said ground electrode free to form said contact bank.

13. The planar filter according to claim 4, including another dielectric layer; said two sides of said substrate being flat; said intermediate electrodes being metallizing layers applied directly to both of said flat sides of said substrate except for regions surrounding said signal line leadthroughs; said two metallizing layers of said intermediate electrodes each being covered by a respective one of said dielectric layers; said ground electrode being substantially continuously constructed; and said ground electrode and said individual signal electrodes being applied to said dielectric layers.

14. The planar filter according to claim 13, wherein said ground electrode has an edge, and including at least one protective covering disposed on at least one side of the planar filter leaving exposed regions near said edge of said ground electrode free to form said contact bank.

15. The planar filter according to claim 4, including another dielectric layer; said two sides of said substrate being flat; said capacitors of said pairs of capacitors being first and second capacitors having said intermediate electrodes and having said ground electrode and said signal electrodes as other capacitor electrodes; said intermediate electrode of said first capacitors being applied to one of said flat sides and one of said other capacitor electrodes of said second capacitors being applied directly to the other of said flat sides of said substrate and each being covered with a respective one of said dielectric layers; said other capacitor electrodes being applied to said dielectric layer covering said intermediate electrode and said intermediate electrodes of said second capacitors being applied to said dielectric layer covering said other capacitor electrodes.

16. The planar filter according to claim 15, wherein said ground electrode has an edge, and including at least one protective covering disposed on at least one side of the planar filter leaving exposed regions near said edge of said ground electrode free to form said contact bank.

17. In multiple-pole plug connectors having plugs or counterpart plugs with a housing making a ground connection, a planar filter disposed in the housing for signal lines carrying electronic signals, comprising:

a substrate having a peripheral region;

a number of closely spaced capacitors being disposed on said substrate and corresponding to a number of signal lines;

said capacitors being formed of one common ground electrode being substantially continuous at least in said peripheral region of said substrate, individual signal electrodes each being provided for a respective one of the signal lines and being insulated from others of the signal lines, and a dielectric layer between said ground electrode and said signal electrodes;

said substrate having openings formed therein each for a respective one of the signal lines, said signal electrodes each extending to or into a respective one of said openings and being connected to a respective one of the signal lines at said respective opening;

each of said capacitors being formed of a series circuit of two substantially equal-size individual capacitors forming a capacitor pair; and intermediate electrodes being applied onto said dielectric layer covering said signal electrodes and to said ground electrode for forming said two series-connected capacitors, said intermediate electrodes covering said dielectric layer covering said signal electrodes and said ground electrode over approximately equal-sized area regions, and said intermediate electrodes covering said ground electrode and said associated signal electrodes with portions of approximately equal area.

* * * * *